(12) United States Patent
Carpenter et al.

(10) Patent No.: US 7,576,569 B2
(45) Date of Patent: Aug. 18, 2009

(54) CIRCUIT FOR DYNAMIC CIRCUIT TIMING SYNTHESIS AND MONITORING OF CRITICAL PATHS AND ENVIRONMENTAL CONDITIONS OF AN INTEGRATED CIRCUIT

(75) Inventors: Gary D. Carpenter, Austin, TX (US); Alan J. Drake, Round Rock, TX (US); Harmander S. Deogun, Austin, TX (US); Michael S. Floyd, Austin, TX (US); Norman K. James, Liberty Hill, TX (US); Robert M. Senger, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 328 days.

(21) Appl. No.: 11/549,138

(22) Filed: Oct. 13, 2006

(65) Prior Publication Data

US 2008/0104561 A1    May 1, 2008

(51) Int. Cl.
*G01R 29/02* (2006.01)
*G06F 17/50* (2006.01)
*H03K 5/22* (2006.01)
(52) U.S. Cl. .................... 327/14; 327/24; 716/14; 716/18
(58) Field of Classification Search ............ 716/14, 716/18; 327/14, 24
See application file for complete search history.

(56) References Cited

U.S. PATENT DOCUMENTS

| | | | |
|---|---|---|---|
| 5,870,404 A | 2/1999 | Ferraiolo et al. | |
| 6,185,706 B1 * | 2/2001 | Sugasawara | 714/724 |
| 6,535,735 B2 * | 3/2003 | Underbrink et al. | 323/283 |
| 6,924,679 B2 * | 8/2005 | Seno et al. | 327/158 |
| 6,958,659 B2 | 10/2005 | Nakajima | |
| 7,071,736 B2 | 7/2006 | Wikstrom | |
| 7,107,558 B2 * | 9/2006 | Tetelbaum et al. | 716/6 |
| 7,190,233 B2 | 3/2007 | Bhushan et al. | |
| 7,265,590 B2 * | 9/2007 | Seki et al. | 327/20 |
| 7,411,436 B2 * | 8/2008 | Fang et al. | 327/262 |
| 2002/0112213 A1 * | 8/2002 | Abadir et al. | 716/4 |
| 2002/0135343 A1 | 9/2002 | Underbrink et al. | |
| 2004/0130372 A1 * | 7/2004 | Seki et al. | 327/278 |
| 2005/0022145 A1 * | 1/2005 | Tetelbaum et al. | 716/6 |

OTHER PUBLICATIONS

Elgebaly, et al., "Efficient Adaptive Voltage Scaling System Through On-Chip Critical Path Emulation", ISLPED 2004, pp. 375-380.
Tschanz, et al., "Adaptive Body Bias for Reducing Impacts of Die-to-Die and Within-Die Parameter Variations on Microprocessor Frequency and Leakage", JSSC, v. 37, No. 11. Nov. 2002.

* cited by examiner

*Primary Examiner*—Stacy A Whitmore
(74) *Attorney, Agent, or Firm*—Mitch Harris, Atty at Law, LLC; Andrew M. Harris; Libby Z. Handelsman

(57) ABSTRACT

A circuit for dynamically monitoring the operation of an integrated circuit under differing temperature, frequency, and voltage (including localized noise and droop), and for detecting early life wear-out mechanisms (e.g., NBTI, hot electrons).

26 Claims, 5 Drawing Sheets

CIRCUIT FOR DYNAMIC CIRCUIT TIMING SYNTHESIS AND MONITORING OF CRITICAL PATHS AND ENVIRONMENTAL CONDITIONS OF AN INTEGRATED CIRCUIT

This invention was made with government support under DARPA, NBCH3039004. THE GOVERNMENT HAS CERTAIN RIGHTS IN THIS INVENTION

BACKGROUND

1. Technical Field of the Present Invention

The present invention generally relates to integrated circuits and, more specifically, to circuits that perform dynamic circuit timing synthesis and monitor critical paths and environmental conditions of the integrated circuit.

2. Description of Related Art

The design of integrated circuits has become increasingly difficult as a result of numerous challenges. One particular challenge has been the ability to predict the cycle time (i.e. the time interval between the start of one cycle and the start of the next cycle) of large-scale integrated circuits. In recent years, this has become progressively complicated from various factors (e.g., scaling) that increase the variation in process, across-chip line width, and response to environmental conditions.

The most common solution for this challenge is to add sufficient margin to the cycle time in order to account for the worst-case variation in timing that can occur as a result of either process or environment variables. Unfortunately with shrinking cycle-times and increasing process variations, the usable portion of the cycle-time has also been decreasing. In other words, cycle time should not be dominated by the design margin, and therefore, cycle times must be increased which reduces the available performance of an integrated circuit in a given technology. Another solution has been to dynamically adjust the cycle-time of an integrated circuit during its operation so as to take full advantage of the available cycle-time (dynamic voltage and frequency scaling). Unfortunately, this technique requires calibration of each integrated circuit at every desired operating point, and this unnecessarily consumes valuable test time.

It would, therefore, be a distinct advantage to have a circuit that would accurately predict the cycle time of an integrated circuit while it is operating. This would allow dynamic voltage and frequency scaling to maximize performance of the integrated circuit at all operating points. The present invention provides such a circuit.

SUMMARY OF THE PRESENT INVENTION

In one aspect, the present invention is a critical path monitoring device residing in an integrated circuit. The critical path monitoring device includes a critical path synthesis circuit capable of simulating a propagation delay that is associated with a critical path of interest during operation of the integrated circuit. The critical path monitoring device also includes a monitoring circuit capable of detecting and storing the progress of the simulation in the synthesis circuit.

BRIEF DESCRIPTION OF THE DRAWINGS

The present invention will be better understood and its advantages will become more apparent to those skilled in the art by reference to the following drawings, in conjunction with the accompanying specification, in which.

Reference now being made to FIG. 4, a diagram is shown illustrating an example of the edge detector 1 of FIG. 3 according to the teachings of the present invention.

DETAILED DESCRIPTION OF THE PREFERRED EMBODIMENT OF THE PRESENT INVENTION

The present invention is a method and system for dynamically monitoring the timing associated with critical paths in an integrated circuit. In addition, the present invention also provides information concerning process and delay variations (e.g., Vdd droop, temperature, and process ageing).

The term "critical path" as used in this specification means a timing parameter within an integrated circuit including, but not limited to, the maximum propagation delay between latches in a circuit(s). For example, the delay of a sub-unit such as an adder can be monitored by the present invention, even though its timing may not necessarily limit the latch-to-latch timing of the entire integrated circuit. A path is considered critical when it is the first path to experience a timing failure as manufacturing process, voltage magnitude, or environmental effects degrade integrated circuit performance.

The term "interpolation" as used in this specification means combining two or more critical paths each having differing delay versus process voltage and temperature curves into a single critical path whose delay versus process voltage and temperature curve is a combination of the curves of the individual critical paths. For example, a wire delay path has a shallower delay versus Process, Voltage, Temperature (PVT) curve then an inverter delay path. If these two paths have the same delay at nominal voltage, than at lower voltages the inverter delay path will be slower than the wire delay path, and at higher voltages the wire delay path will be slower than the inverter delay path due to their voltage sensitivities. By logically combining the two paths, for example, through an AND condition gate, the resulting path interpolates between the two paths by following the delay of the slower path at each voltage (i.e., the inverter path at lower voltage and the wire path at higher voltage).

Figure 1:
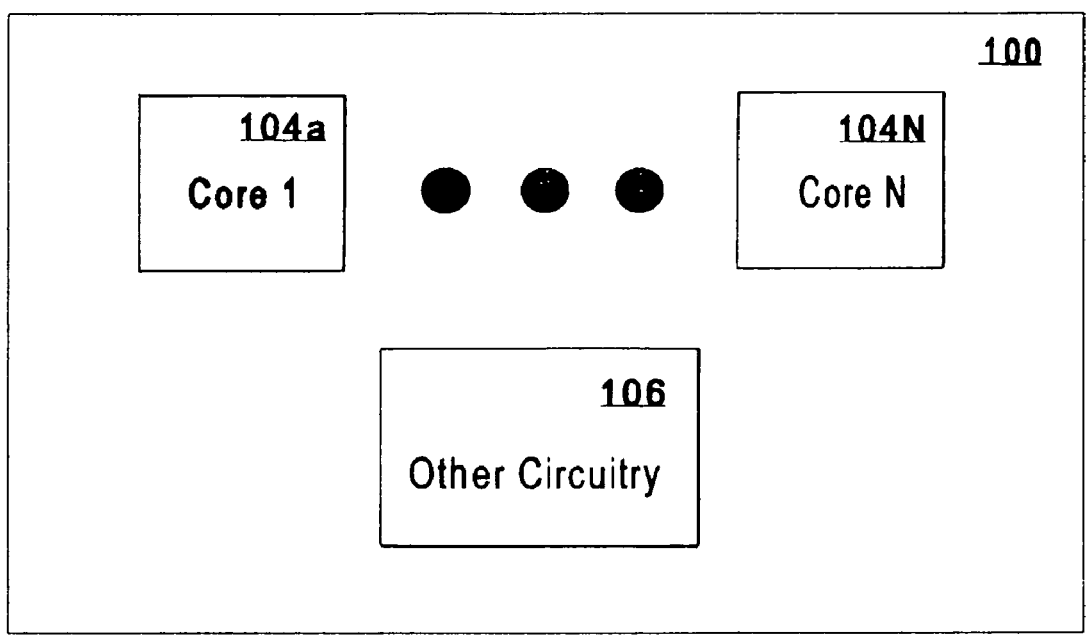
FIG. 1 is a block diagram illustrating an integrated circuit, such as a microprocessor, in which the present invention can be implemented.

Reference now being made to FIG. 1, a block diagram is shown illustrating an integrated circuit 100, such as a microprocessor, in which the present invention can be implemented. Integrated circuit 100 represents a convenient example for explaining the various aspects of the present invention and is not to be considered a limitation on the various types of integrated circuits to which the present invention is applicable.

Integrated circuit 100 (such as a chip or die) can be, for example, a multi-core microprocessor having cores 104A-N and various other circuitry 106 (e.g., bus, caches, and the like) for providing the interface to the cores 104-N in a well known and understood fashion.

The present invention provides the ability to implement dynamic timing monitoring for critical paths in an integrated circuit 100 of FIG. 1 as explained in greater detail in connection with FIG. 2.

Figure 2:
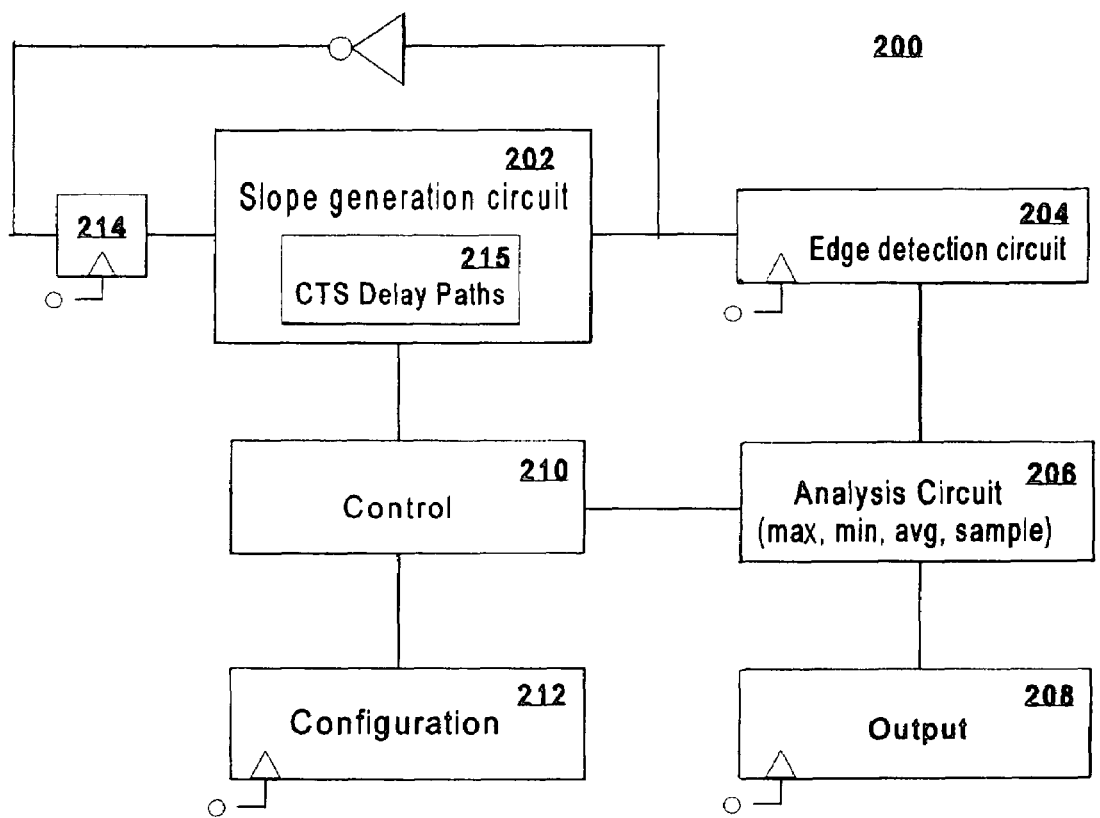
FIG. 2 is a diagram illustrating a Cycle Time Synthesizer (CTS) circuit 200 that provides active timing control in an integrated circuit of FIG. 1 according to the teachings of the present invention.

Reference now being made to FIG. 2, a diagram is shown illustrating a block diagram of a Cycle Time Synthesizer (CTS) circuit 200 that simulates the activity of a critical path in the integrated circuit 100 of FIG. 1 according to the teachings of the present invention. In contrast to other typical circuits that monitor a critical path, the CTS circuit 200 is not physically connected to the critical path to be monitored, but rather, is placed in close proximity to the critical path so that any variations in process or environmental conditions between the critical path and cTrs circuit 200 are minimal.

In general, the CTS circuit 200 actively simulates the condition of a selected critical path and provides analysis data (e.g., statistical) concerning the timing delays associated with that critical path during operation of the integrated circuit 100. The analysis data can be used by the integrated circuit 100 itself or some external device for altering the operation of the integrated circuit 100 to achieve a specified throughput while avoiding timing failures associated with the monitored critical path.

The Cycle Time Synthesizer (CTS) circuit 200 includes a Process, Voltage, Temperature (PVT) slope generation circuit 202, an edge detection circuit 204, a control circuit 210, an analysis circuit 206, an output register 208, and a configuration register 212. Each of these elements is explained briefly below with a more detailed explanation being provided in connection with the specific implementation illustrated in FIG. 3.

The Process, Voltage Temperature (PVT) slope generation circuit 202 receives a rising or falling edge upon the occurrence of a timing event φ (e.g., system clock or a control signal) from latch 214. The inverter 216 inverts the previously launched edge to provide an edge that is opposite from the previous edge (e.g., rising if previous was falling). In the preferred embodiment of the present invention, a rising edge or a falling edge is received during each cycle of the system clock.

The PVT slope generation circuit 202 includes multiple delay paths ("CTS Delay Paths" 215) each having differing PVT curves (delays associated with particular elements such as gates, wires, and the like, and any affect on this delay that is result of process, voltage, temperature or other environmental factors), and the capability to combine two or more of these CTS Delay Paths to create an interpolated PVT curve. The edge detection circuit 204 detects and captures each received edge and its position relative to the timing event (e.g., system clock or control signal). This information is provided to the analysis circuit 206. The analysis circuit 206 performs various calculations on the received information to generate, using circuitry, software, or some combination thereof, data (e.g., maximum, minimum, average and variance statistics) that can be accessed via the output register 208 by the integrated circuit 100 itself or an external device. For example, the statistical analysis of the data can be accomplished using a moving average, maximum, minimum, or some other circuit. In yet another example, the statistical analysis can also be done by software reading the output register and recording the data over a period of time. In the preferred embodiment, the analysis circuit 206 is also used to interpolate between the slower of two chosen CTS Delay Paths to create a new PVT curve. It should be noted, however, that the PVT curve interpolation can occur elsewhere within or external to the CTS circuit 200 (e.g., the PVT slope generation circuit 202)

The control circuit 210 retrieves various configuration information stored in the configuration register 212 (which can be accessed internally or externally) and selects one or more CTS Delay Paths, specifies the number of edges to be captured by the edge detection circuit 204, and the type of analysis data to be generated by the analysis circuit 206.

The CTS circuit 200 can be calibrated in order to provide a more accurate synthesis of the critical path being monitored. The calibration is accomplished by statistical qualification to determine the delay versus PVT slopes of each CTS Delay Path, including interpolated paths, of the CTS circuit 200 over the operating points and the process corners of the integrated circuit 100 for the monitored critical path as demonstrated in the minimum cycle time of the integrated circuit 100.

An example of a detailed implementation for the Cycle Time Synthesizer circuit (CTS) 200 of FIG. 2 is illustrated and explained below in connection with FIG. 3.

Figure 3:
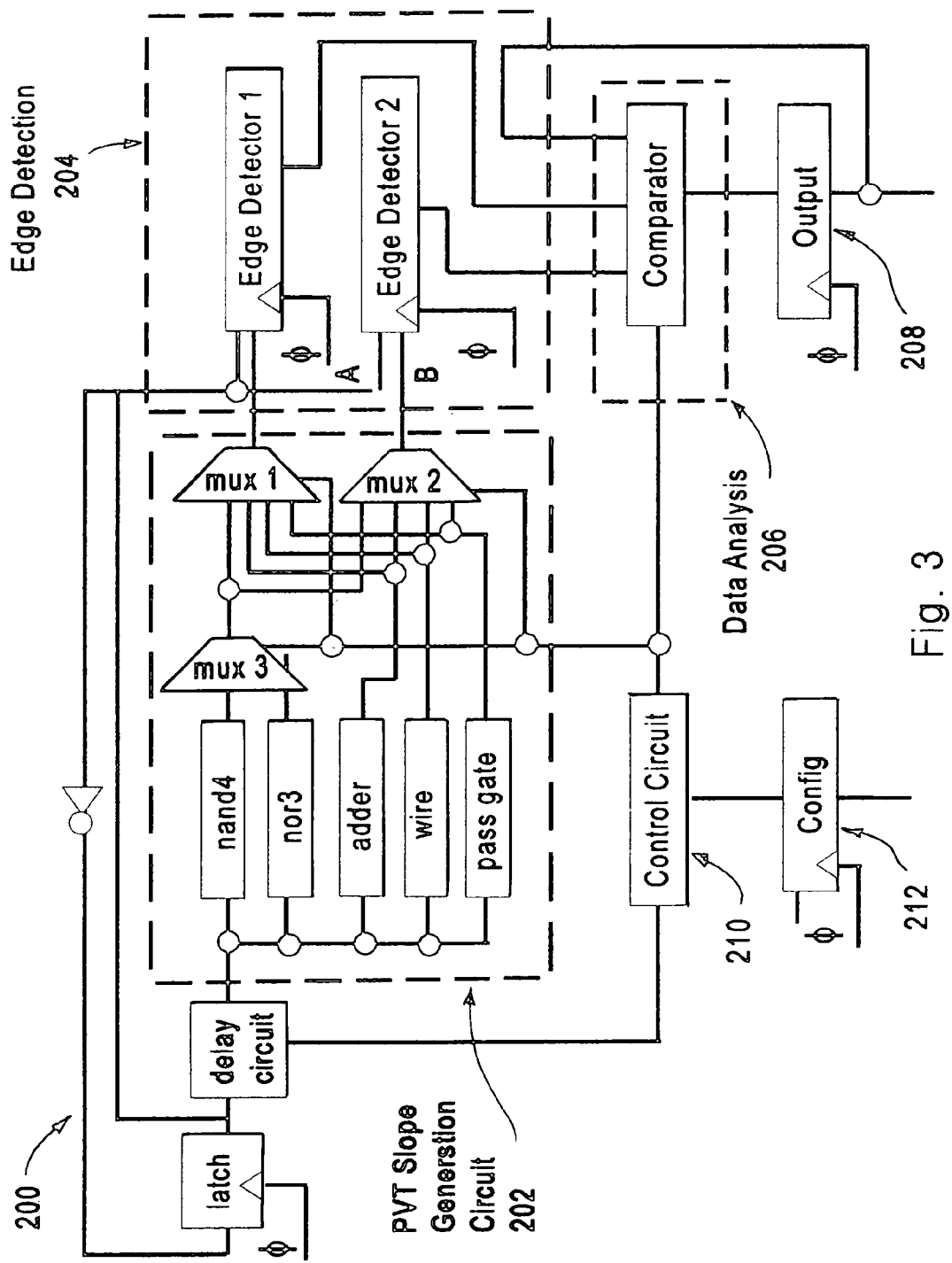
FIG. 3 is a diagram illustrating an example of a detailed implementation for the Cycle Time Synthesizer circuit (CTS) of FIG. 2 according to the teachings of the present invention.

Reference now being made to FIG. 3, a diagram is shown illustrating an example of a detailed implementation for the Cycle Time Synthesizer circuit (CTS) 200 of FIG. 2 according to the teachings of the present invention.

In this implementation, the PVT slope generation circuit 202 includes the following five CST Delay Paths:

1.) a chain of fan-in-of-four nand gates;
2.) a chain of fan-in-of-three nor gates;
3.) an adder critical path (XOR and NAND gates);
4.) a wire; and
5.) a chain of pass-gates.

It should be noted that other types or combinations of circuits for the Delay Paths can also be used in addition or in place of those listed above.

The PVT slope generation circuit 202 receives the falling or the rising edge of the system clock on alternating clock cycles (only one edge is launched per cycle). It should be noted, that multiple edges can also be launched per cycle as well. The PVT slope generation circuit 202 can optionally include a delay circuit for providing additional delay when required to fine tune one or more of the delay paths. Each received edge is provided to each of the CST Delay Paths one or more of which can be provided to the edge detection circuit via the use of the multiplexers (mux 1-3). The selection of the CST Delay Path(s) is such that the delay for the received edge to exit the selected CST Delay Path(s) closely matches the delay of the monitored critical path.

The edge detection circuit 204 includes two edge detectors (detector 1-2) capable of receiving data from one or more of the five delay paths via the use of multiplexers (mux 1-3) as selected by the control circuit 210. An example of a preferred embodiment for edge detector 1 is illustrated in FIG. 4.

Figure 4:
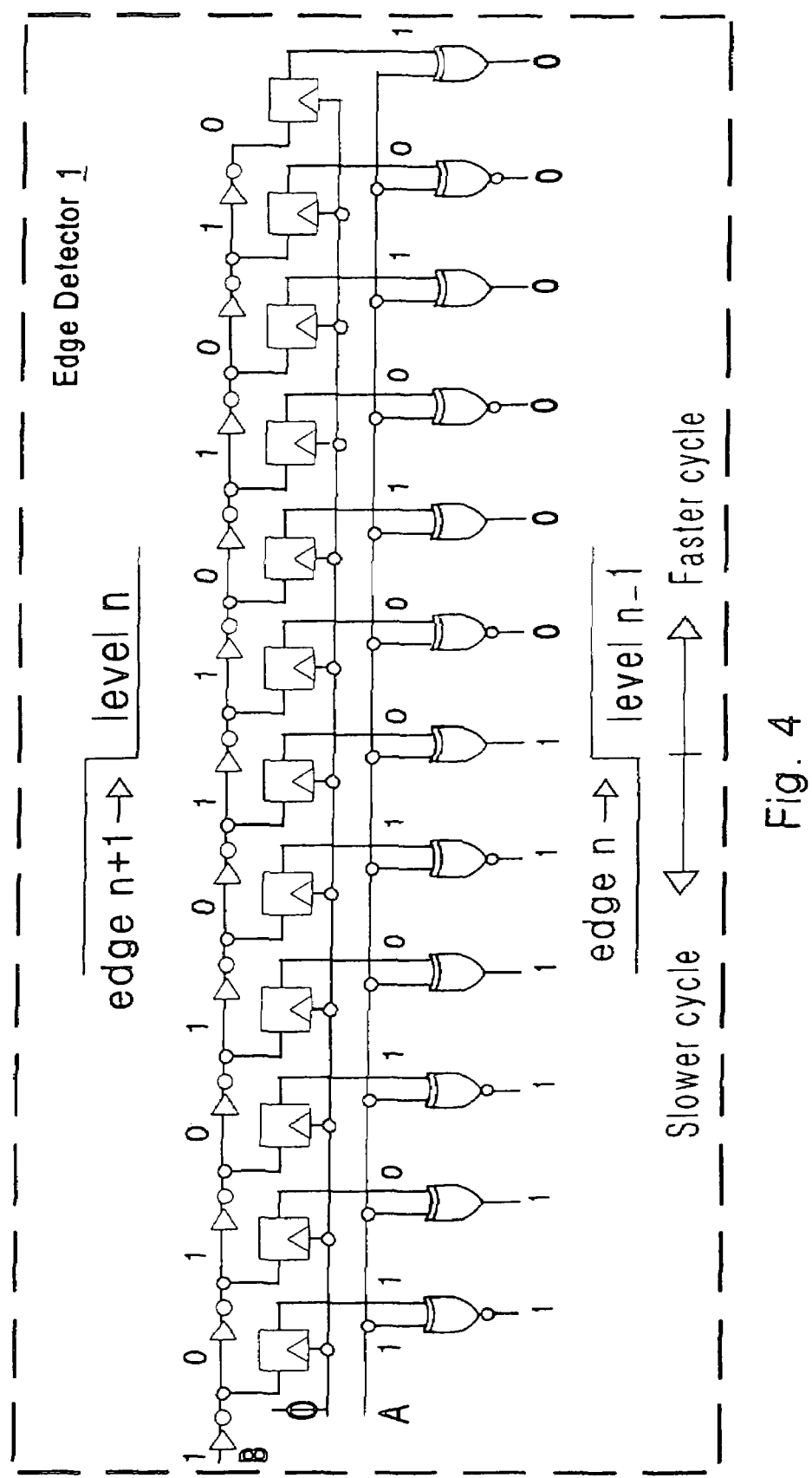

Reference now being made to FIG. 4, a diagram is shown illustrating an example of the edge detector 1 of FIG. 3 according to the teachings of the present invention. In general, the edge detector 1 includes a plurality of buffers, latches, and XOR gates configured as shown. As previously discussed, the edge detector 1 receives an edge (rising or falling) from one or more of the CTS Delay Paths. In this example, the rising edge is provided to the latches as it is passed through the inverters, and the falling edge is provided directly to the NOR or XNOR gate as the case may be. A synchronization signal φ (e.g., clock signal) is received by the latches to release a previously stored falling edge to a corresponding XOR or XNOR gate.

The XOR and XNOR gates compare the previously stored falling edge and currently received rising edge to produce a binary output from the XOR and XNOR gates that is representative of the propagation delay associated with the monitored critical path (i.e., as the falling edge travels through the chain of inverters it will not necessarily be received by all of the inverters). The position of the 1 to 0 transition in the output from the XOR mid XNOR gates indicates the delay of the COTS Delay Path with respect to the timing event.

The analysis circuit 206 includes a comparator, coupled to the binary output of each of the edge detectors 1-2, that is selectable via the control circuit 210 for comparing the data received from edge detectors 1-2 and the previous analysis data stored in output register 208. The comparison is used to determine the slowest CTS Delay Path and provide the ability to select this path for further data analysis (i.e., interpolate between two different CTS Delay Paths versus PVT slopes). For example, assume for the moment that the wire CTS Delay Path and fan-in-of-three NOR gates CTS Delay Path are selected. Also assume, that the fan-in-of-three NOR gates CTS Delay Path has the worst case delay at low voltages and the wire CTS Delay Path has the worst case delay at high voltages. The analysis circuit 206 interpolates between the fan-in-of-three NOR gates CTS Delay Path at low voltages and the wire CTS Delay Path at high voltages to synthesize a PVT curve with a single inflection point joining two unique slopes. In this manner, multiple CTS Delay Paths can be combined to synthesize a large number of unique PVT slopes from a relatively small number of CTS Delay Paths.

The CTS circuit 200 can be calibrated in order to provide a more accurate synthesis of the critical path being monitored. More specifically, calibration is used to determine the bit position of one or more CTS Delay Paths with respect to the synchronization event (e.g., system clock) when the integrated circuit 100 reaches its maximum frequency at each of its operating points. Calibration is also used to position the edge in the edge detectors 1-2 in an optimal position and to provide a reference for adding timing margin.

The first step of calibration is to store the bit position at integrated circuit 100 failure for each of the CTS Delay Paths at each process, voltage, and temperature point at which the integrated circuit 100 will operate. The bit position at failure is measured by selecting a CTS Delay Path and reducing the cycle time (increasing the frequency) of the integrated circuit 100 until it falls. The bit position at failure and the failure frequency are then recorded for that operating point.

The second step of calibration is to determine the bit position at failure versus PVT curve for each CTS Delay path, including interpolating CTS Delay Paths by performing statistical analysis on the data generated in the previous step.

The third calibration step is to compare the bit position at failure versus PVT curve of each CTS Delay Path with the minimum delay versus PVT curve of the integrated circuit 100. The CTS Delay Path whose curve most closely watches the curve of the integrated circuit 1100 at a given process corner will be selected as the path to monitor. These three steps are used to generate a statistical probability of the integrated circuit 100 failure position for each process corner. This process is called qualification or characterization over PVT.

The fourth calibration step is to measure and save, at one or more operating point, the bit position at failure of the CTS Delay path(s) and the process corner of an integrated circuit that was not previously used for qualification in the above noted steps. With the bit position at failure recorded at calibration and the bit position at failure versus PVT curves generated during qualification, the integrated circuit 100 or system monitoring the integrated circuit 100 can determine the likely bit position at failure of all other operating points to which the integrated circuit 100 is subjected. The CTS circuit 200 reading that indicates a failure at locations between the operating points used for calibration are determined using a fitting formula, such as a linear fit, that is based on the statistical qualification data. An individual integrated circuit to be calibrated with just a few measurements once the qualification of the CTS Delay Paths has been performed. Test time is valuable, so it is important to reduce the number of measurements required to calibrate a CTS Circuit 200

The CTS circuit 200 can be distributed around the integrated circuit 100 as explained in connection with FIG. 5 below.

Figure 5:
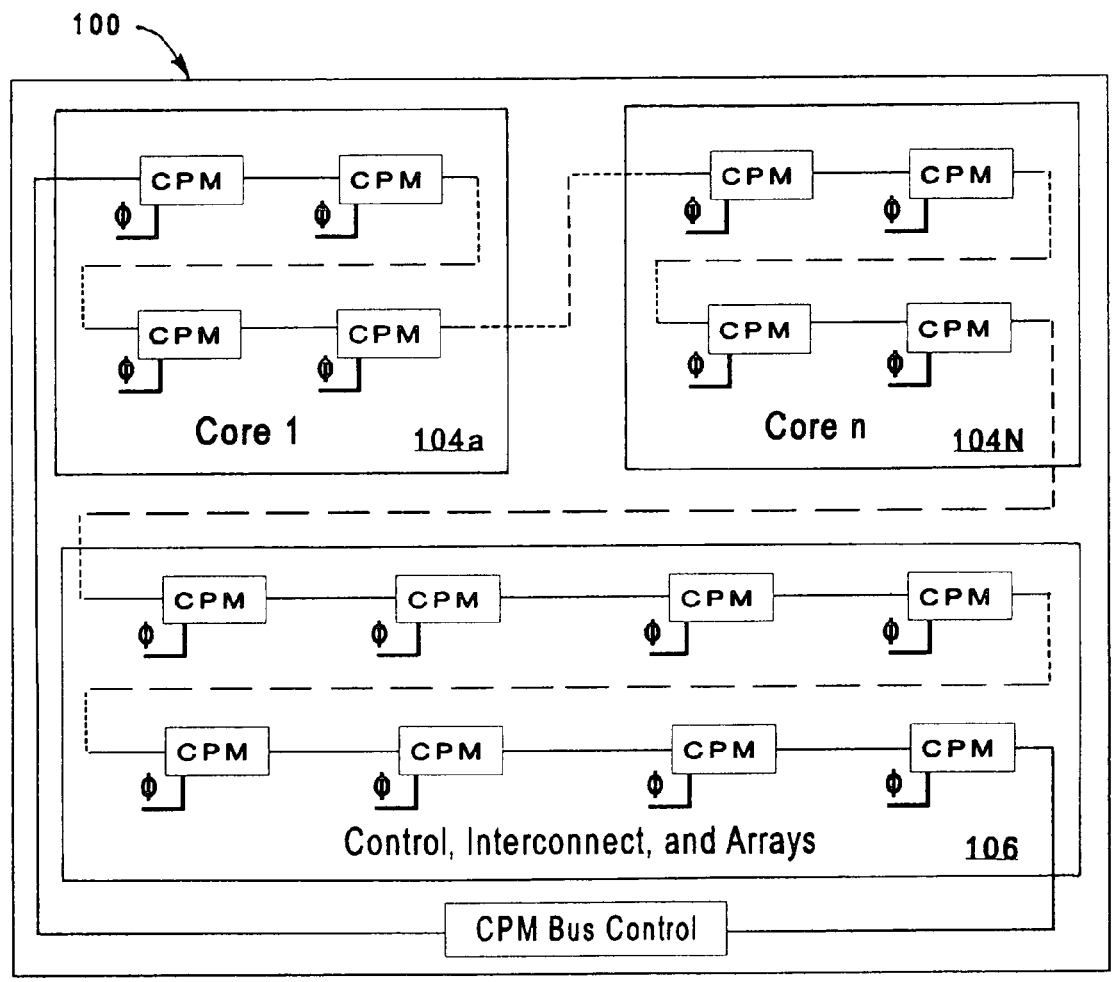
FIG. 5 is a diagram illustrating an example of how multiple instances of the CTS circuit of FIG. 2 can be implemented in the integrated circuit of FIG. 1 according to the teachings of the present invention.

Reference now being made to FIG. 5, a diagram is shown illustrating an example of how multiple instances of the CTS circuit 200 of FIG. 2 can be implemented in the integrated circuit 100 of FIG. 1 according to the teachings of the present invention. In this example, multiple instances of the CTS circuit 200 are distributed between the Cores 104a-n and the other circuitry 106 (which can include control, interconnect and arrays).

By distributing the CTS circuit 200 in this fashion it can also serve the purpose of a process monitor. For example, by selecting the same CTS Delay Path in multiple CTS circuits and comparing the change in the delay between the two CTS Delay Paths differences in process and environmental conditions between the two locations in the integrated circuit 100 can be determined. Delay variation can also be measured by holding the CTS Delay Path, voltage, and frequency constant on a given CTS circuit 200 and analyzing the variance of the delay as sampled by the CTS circuit 200.

In addition, comparing CTS circuits 200 that are located at physical distances from one another provides the ability for spatial analysis of temperature and process change of the integrated circuit 100.

Furthermore, the CTS 200 circuit outputs can be compared with a constant delay path, voltage, and frequency to detect localized voltage supply droops and noise.

In addition, comparing CTS circuit operation with a given delay path, voltage, and frequency taken at different points in time provides for an analysis of early life wear out mechanisms such as Negative-Bias Temperature Instability (NTBI) and hot electrons.

It is thus believed the operation and construction of the present invention will be apparent from the foregoing description. While die method and system shown and described has been characterized as being preferred, it will be readily apparent that various changes and/or modifications could be made without departing from the spirit and scope of the present invention as defined in the following claims.

What is claimed is:

1. An integrated circuit, comprising:
   a functional logic circuit for providing a function of the integrated circuit, wherein the functional logic circuit has a critical path;
   a critical path synthesizer circuit having a plurality of delay paths, wherein the delay paths are designed to have differing process-voltage-temperature slopes;
   a monitoring circuit coupled to an output of the critical path synthesizer circuit for measuring delays of the delay paths; and
   an analysis circuit for computing a critical path delay result representative of the critical path of the functional circuit from the delays of at least two of the delay paths as measured by the monitoring circuit.

2. The integrated circuit of claim 1, wherein the monitoring circuit measures a first delay of a first delay path and a second delay of a second delay path, and wherein the analysis circuit interpolates between the first delay and the second delay to compute the critical path delay result.

3. The integrated circuit of claim 1, wherein the critical path synthesizer circuit further comprises a selector for selecting among the delay paths.

4. The integrated circuit of claim 3, wherein the critical path synthesizer circuit further comprises a control circuit having an output coupled to a control input of the selector for first selecting a first one of the delay paths and second selecting a second one of the delay paths, wherein the monitoring circuit measures a first delay of the first delay path and a second delay of the second delay path.

5. The integrated circuit of claim 4, wherein the analysis circuit interpolates between the first delay and the second delay to obtain the critical path delay result.

6. The integrated circuit of claim 4, wherein the control circuit selects between the first one of the delay paths and the second one of the delay paths in sequence, and wherein the monitoring circuit measures the first delay, stores the first delay, and measures the second delay.

7. The integrated circuit of claim 6, wherein the analysis circuit interpolates between the first delay and the second delay to obtain the critical path delay result.

8. The integrated circuit of claim 4, wherein the control circuit comprises a first selector for selecting a first one of the delay paths and a second selector for simultaneously selecting a second one of the delay paths, and wherein the monitoring circuit comprises a first delay measurement circuit and a second delay measurement circuit for simultaneously measuring the first delay and the second delay.

9. The integrated circuit of claim 8, wherein the analysis circuit interpolates between the first delay and the second delay to obtain the critical path delay result.

10. The integrated circuit of claim 1, wherein the monitoring circuit comprises an edge detection circuit.

11. A method of monitoring a critical path within a functional block of an integrated circuit, comprising:
    first measuring a first delay of a delay path within a critical path synthesis circuit, comprising multiple delay paths designed to have differing process-voltage-temperature slopes;
    second measuring a second delay of a second one of the multiple delay paths; and
    computing a critical path delay result representative of the critical path within the functional block of the integrated circuit from a first result of the first measuring and a second result of the second measuring.

12. The method of claim 9, wherein the computing comprises interpolating between the first delay and the second delay.

13. The method of claim 9, further comprising selecting from among the delay paths using a selector.

14. The method of claim 13, wherein the selecting selects between a first one of the delay paths and a second one of the delay paths in sequence, wherein the first measuring measures the first delay of the first delay path and stores the first delay, and wherein the computing uses the stored first delay to obtain the critical path delay result.

15. The method of claim 14, wherein the computing comprises interpolating between the first delay and the second delay to obtain the critical path delay result.

16. The method of claim 13, wherein the selecting selects a first one of the delay paths using a first selector and simultaneously selects a second one of the delay paths using a second selector, and wherein the measuring first measures a first delay of the first one of the delay paths and simultaneously second measures a second delay of the second one of the delay paths.

17. The method of claim 16, wherein the computing comprises interpolating between the first delay and the second delay to obtain the critical path delay result.

18. An integrated circuit integrated on a single die, comprising:
    a plurality of functional logic circuits for providing functions of the integrated circuit, wherein the functional logic circuits have distinct critical paths;
    a plurality of critical path test circuits distributed across the die and associated with nearby ones of the functional logic circuits, wherein the critical path test circuits comprise a critical path synthesizer circuit having a plurality of delay paths, a monitoring circuit for measuring delays of delay paths, and an analysis circuit for computing critical path delays representative of the critical paths within nearby functional circuits; and
    an interconnect for providing an interface to the multiple critical path test circuits.

19. The integrated circuit of claim 18, wherein the monitoring circuits measure a first delay of a first delay path and a second delay of a second delay path, and wherein the analysis circuits interpolate between the first delay and the second delay to compute the critical path delay result.

20. The integrated circuit of claim 18, wherein the critical path synthesizer circuits further comprise selectors for selecting from among the delay paths.

21. The integrated circuit of claim 20, wherein the critical path synthesizer circuits further comprise control circuits having outputs coupled to control inputs of the selectors for first selecting a first one of the delay paths and second selecting a second one of the delay paths, wherein the monitoring circuits measure a first delay of the first delay path and a second delay of the second delay path, and wherein the analysis circuits interpolate between the first delay and the second delay to obtain the critical path delay result.

22. The integrated circuit of claim 21, wherein the control circuits select between the first one of the delay paths and the second one of the delay paths in sequence, and wherein the monitoring circuits measure the first delay, store the first delay, and measure the second delay.

23. The integrated circuit of claim 22, wherein the analysis circuits interpolate between the first delay and the second delay to obtain the critical path delay result.

24. The integrated circuit of claim 21, wherein the control circuits comprise a first selector for selecting a first one of the delay paths and a second selector for simultaneously selecting a second one of the delay paths, and wherein the monitoring circuits comprise a first delay measurement circuit and a second delay measurement circuit for simultaneously measuring the first delay and the second delay.

25. The integrated circuit of claim 24, wherein the analysis circuits interpolate between the first delay and the second delay to obtain the critical path delay result.

26. The integrated circuit of claim 18, wherein the monitoring circuits comprise edge detection circuits.

* * * * *